United States Patent
Sato et al.

(10) Patent No.: US 12,537,503 B2
(45) Date of Patent: Jan. 27, 2026

(54) FILTER DEVICE AND MULTIPLEXER

(71) Applicant: Murata Manufacturing Co., Ltd., Nagaokakyo (JP)

(72) Inventors: Tomoya Sato, Nagaokakyo (JP); Hiroyuki Furusato, Nagaokakyo (JP); Takayuki Okude, Nagaokakyo (JP); Seima Kondo, Nagaokakyo (JP); Kota Okubo, Nagaokakyo (JP); Yoshinori Kameoka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 140 days.

(21) Appl. No.: 18/399,792

(22) Filed: Dec. 29, 2023

(65) Prior Publication Data
US 2024/0137000 A1 Apr. 25, 2024
US 2024/0235520 A9 Jul. 11, 2024

Related U.S. Application Data

(63) Continuation of application No. PCT/JP2022/027086, filed on Jul. 8, 2022.

(30) Foreign Application Priority Data

Jul. 8, 2021 (JP) ................. 2021-113466

(51) Int. Cl.
*H03H 9/05* (2006.01)
*H03H 9/02* (2006.01)
*H03H 9/64* (2006.01)

(52) U.S. Cl.
CPC ...... *H03H 9/0576* (2013.01); *H03H 9/02574* (2013.01); *H03H 9/02661* (2013.01); *H03H 9/6433* (2013.01)

(58) Field of Classification Search
CPC ............ H03H 9/6433; H03H 9/02661; H03H 9/02574; H03H 9/0576
(Continued)

(56) References Cited

U.S. PATENT DOCUMENTS

2014/0368296 A1 12/2014 Nishizawa
2019/0190494 A1 6/2019 Nosaka
(Continued)

FOREIGN PATENT DOCUMENTS

JP H09270663 A 10/1997
JP 2005260909 A 9/2005
(Continued)

OTHER PUBLICATIONS

International Search Report in PCT/JP2022/027086, mailed Sep. 6, 2022, 3 pages.
(Continued)

*Primary Examiner* — Rakesh B Patel
(74) *Attorney, Agent, or Firm* — Keating & Bennett, LLP

(57) ABSTRACT

A filter device includes a piezoelectric substrate, a dielectric layer on the piezoelectric substrate, a first IDT electrode on the dielectric layer, a second IDT electrode positioned on the piezoelectric substrate in an area where the dielectric layer is not provided such that the first and second IDT electrodes are side by side in an acoustic wave propagation direction extending along a principal surface of the piezoelectric substrate, a first reflector on the dielectric layer and adjacent to the first IDT electrode on a side of the second IDT electrode, and a second reflector on the piezoelectric substrate and adjacent to the second IDT electrode on a side of the first IDT electrode. The dielectric layer includes an edge portion between the first and second reflectors in planar view seen from a stacking direction of the piezoelectric substrate and the dielectric layer.

20 Claims, 6 Drawing Sheets

(58) Field of Classification Search
USPC .................................................. 333/186–193
See application file for complete search history.

(56) References Cited

U.S. PATENT DOCUMENTS

2020/0304104 A1   9/2020  Araki
2021/0384924 A1   12/2021 Nakamura et al.

FOREIGN PATENT DOCUMENTS

| JP | 2015002511 A | 1/2015 |
| WO | 2018043607 A1 | 3/2018 |
| WO | 2020138290 A1 | 7/2020 |
| WO | 2020179906 A1 | 9/2020 |

OTHER PUBLICATIONS

Written Opinion in PCT/JP2022/027086, mailed Sep. 6, 2022, 4 pages.

FILTER DEVICE AND MULTIPLEXER

CROSS REFERENCE TO RELATED APPLICATIONS

This application claims the benefit of priority to Japanese Patent Application No. 2021-113466 filed on Jul. 8, 2021 and is a Continuation application of PCT Application No. PCT/JP2022/027086 filed on Jul. 8, 2022. The entire contents of each application are hereby incorporated herein by reference.

BACKGROUND OF THE INVENTION

1. Field of the Invention

The present invention relates to filter devices and multiplexers.

2. Description of the Related Art

There are filter devices including surface acoustic wave devices (SAW resonators) that filter signals using surface acoustic waves (SAW). It is desirable that the filter device has a band characteristic with a large bandwidth and a small size. Japanese Unexamined Patent Application Publication No. 2005-260909 describes a SAW resonator that enables downsizing of the filter device by reducing the difference between an anti-resonant frequency and a resonant frequency of the SAW resonator.

SUMMARY OF THE INVENTION

When the downsizing of a filter device becomes possible by using the SAW resonator described in Japanese Unexamined Patent Application Publication No. 2005-260909, a gap between the SAW resonators in the filter device becomes smaller. Because the SAW resonators are provided at positions close to each other, in some cases, a surface acoustic wave leaked from one of the SAW resonators reaches the other SAW resonator that is provided in a propagation direction of the surface acoustic wave.

The surface acoustic wave that has reached the other SAW resonator changes the frequency characteristic of the other SAW resonator. Because of the change in the frequency characteristic, in some cases, a pass band of the filter device having that SAW resonator becomes narrower.

Example embodiments of the present invention provide filter devices each having a small size and capable of filtering a signal with a large bandwidth.

A filter device according to one aspect of an example embodiment of the present invention includes.

According to example embodiments of the present invention, filter devices each have a small size and filter a signal with a large bandwidth.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Figure 1:
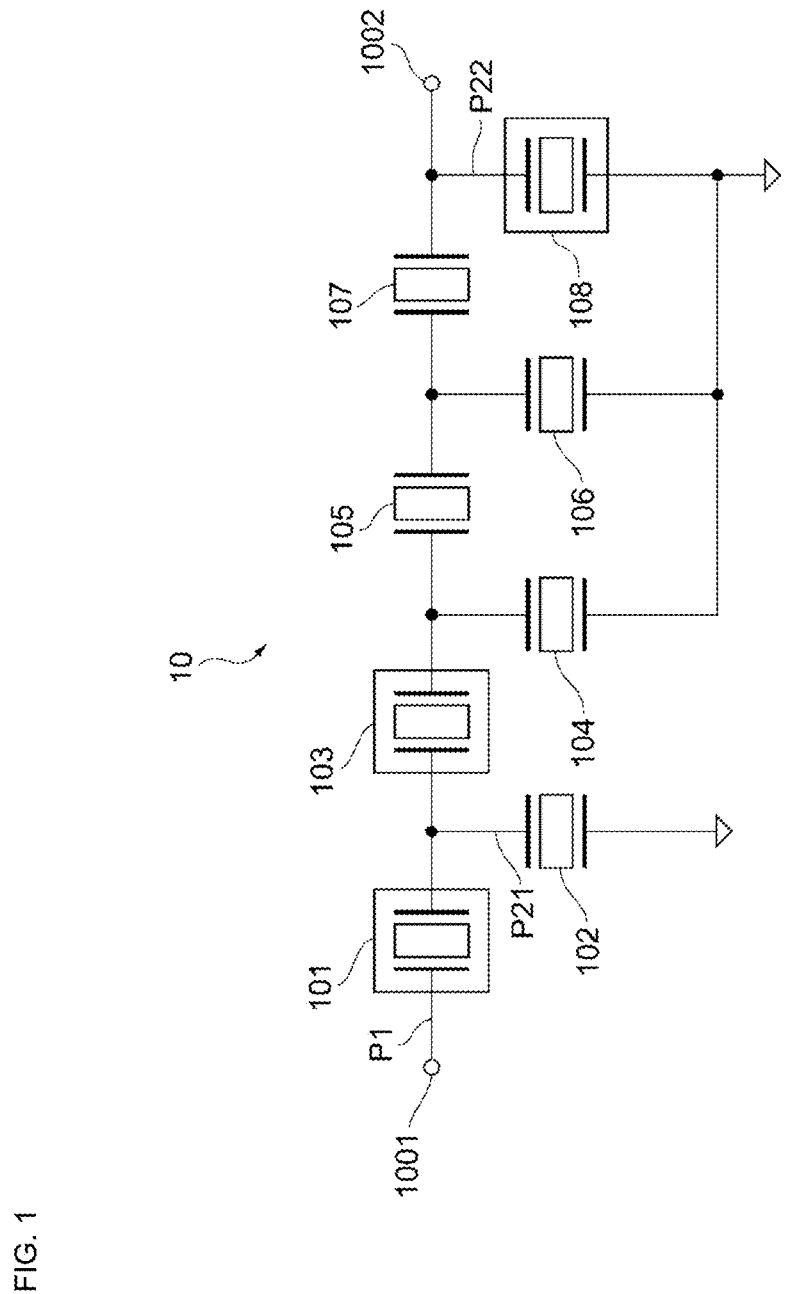
FIG. 1 is a circuit diagram of a filter device according to a first example embodiment of the present invention.

Hereinafter, example embodiments of the present invention are described in detail with reference to the drawings. Note that same reference characters are attached to same constituent elements, and overlapping descriptions are omitted as much as possible.

A first example embodiment is now described. FIG. 1 illustrates a circuit diagram of a filter device 10 according to the first example embodiment. The filter device 10 includes resonators 101, 102, 103, 104, 105, 106, 107, and 108. The filter device 10 includes a line P1 (first line or third line) that connects an input terminal 1001 (first terminal or third terminal) and an output terminal 1002 (second terminal or fourth terminal).

The resonators 101, 103, 105, and 107 are connected in series and are provided in the line P1. The filter device 10 includes a line P21 (second line) that branches off from the line P1 (first line) and connects the line P1 and ground. The resonator 102 is provided in the line P21. The filter device 10 includes a line P22 (fourth line) that branches off from the line P1 (third line) and connects the line P1 and the ground. The resonator 108 is provided in the line P22. Further, the resonators 104 and 106 are each provided between the line P1 and the ground.

The filter device 10 is a band pass filter that outputs, of radio frequency signals input to the input terminal 1001, a radio frequency signal of a predetermined frequency band from the output terminal 1002. Alternatively, the filter device 10 may be a band elimination filter that outputs a radio frequency signal in which a radio frequency signal of a predetermined frequency band is attenuated.

The resonators 101, 102, 103, 104, 105, 106, 107, and 108 are each a SAW resonator that has a predetermined frequency characteristic generated by excitation and reception of surface acoustic waves (SAW). The resonators 101, 102, 103, 104, 105, 106, 107, and 108 are each, for example, a resonator that excites Love waves.

In FIG. 1, the resonators 101, 103, and 108 are illustrated in a mode different from that of the resonators 102, 104, 105, 106, and 107. This indicates a difference in structure between the resonators 101, 103, and 108 and the resonators 102, 104, 105, 106, and 107.

Figure 2:
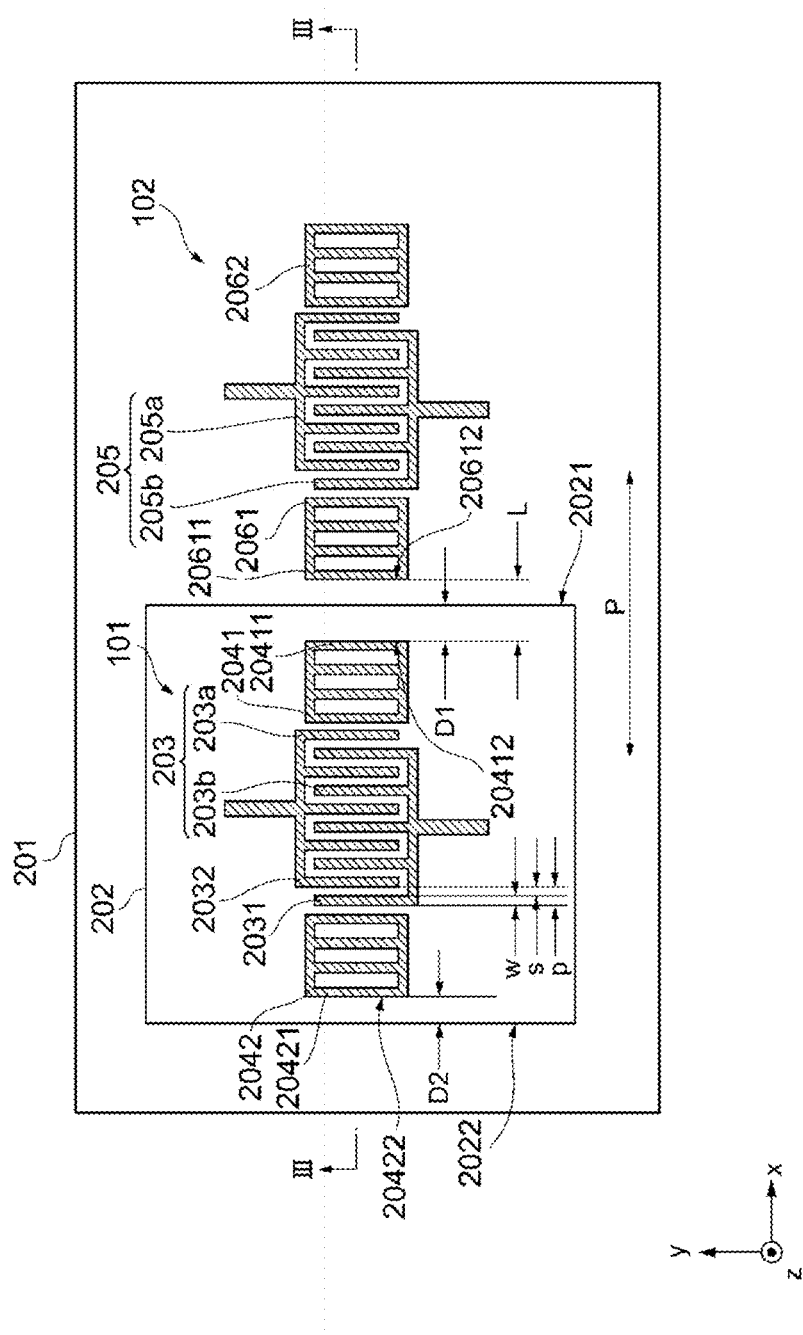
FIG. 2 is a layout diagram for illustrating a filter according to the first example embodiment of the present invention.
Figure 3:
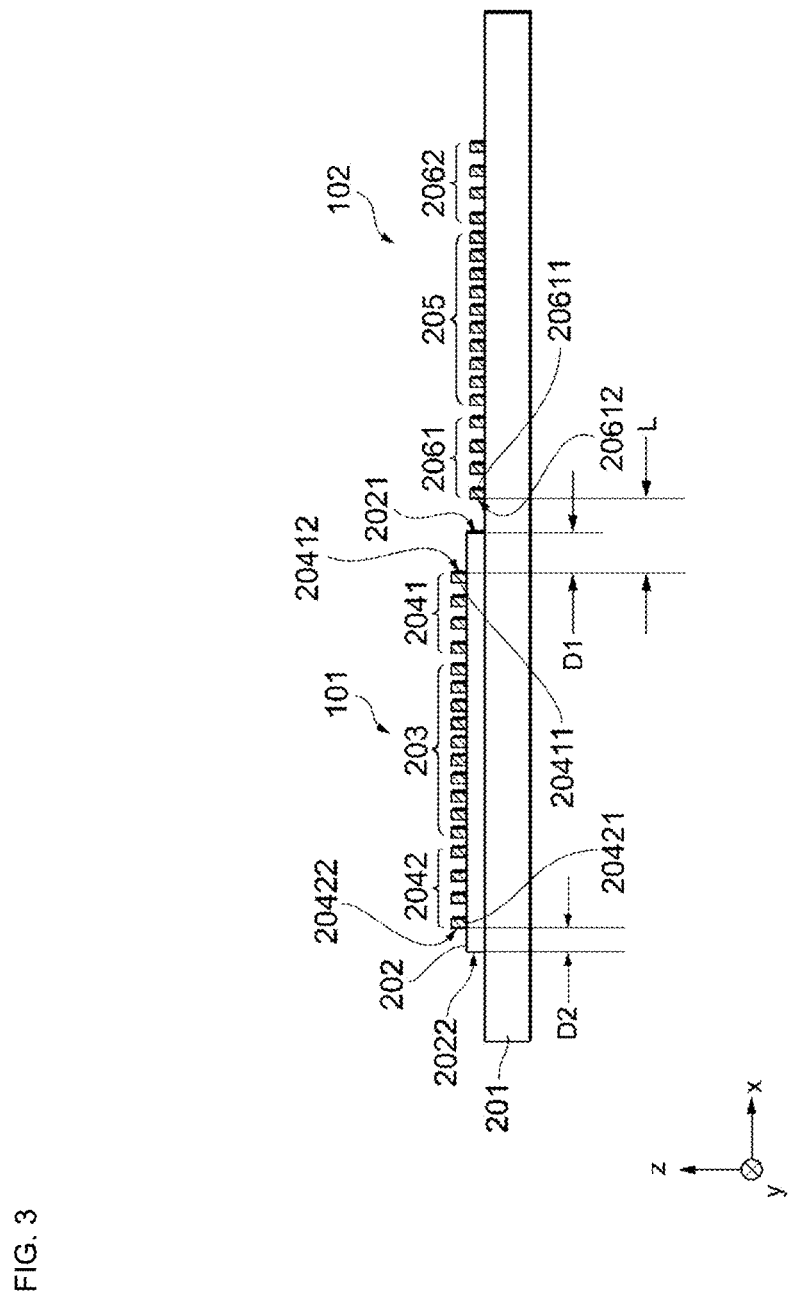
FIG. 3 is a cross-sectional view taken along a cross-section in FIG. 2.

Referring to FIG. 2 and FIG. 3, structures and layouts of the resonator 101 and the resonator 102 are described. FIG. 2 is a diagram illustrating the layouts of the resonator 101 and the resonator 102, and FIG. 3 is a cross-sectional view taken along a cut line of FIG. 2.

The resonators 101 and 102 are provided on a piezoelectric substrate 201. The piezoelectric substrate 201 is a substrate having piezoelectricity. The material of the piezoelectric substrate 201 is, for example, lithium niobate ($LiNbO_3$). The material of the piezoelectric substrate 201 is not limited to lithium niobate and may alternatively be any appropriate piezoelectric material such as, for example, lithium tantalate ($LiTaO_3$) or the like. The piezoelectric substrate 201 includes a principal surface parallel to the x-y plane of FIG. 2. FIG. 2 is planar view of the principal surface of the piezoelectric substrate 201 seen from the principal surface (z-axis direction) on the side where a dielectric layer 202 of the piezoelectric substrate 201 is provided.

The dielectric layer 202 is provided on the piezoelectric substrate 201. In FIG. 2, the dielectric layer 202 is provided on the z-axis positive direction side of the piezoelectric substrate 201. The dielectric layer 202 is a layer provided by depositing a dielectric material on a portion of the area of the piezoelectric substrate 201. The material of the dielectric layer 202 is, for example, silicon dioxide ($SiO_2$) or silicon nitride (SiN).

In planar view of the piezoelectric substrate 201, the dielectric layer 202 includes an edge portion 2021 (first edge portion) and an edge portion 2022 (second edge portion) that faces the edge portion 2021. Each of the edge portion 2021 and the edge portion 2022 is an outer edge of the dielectric layer 202 in the planar view of the piezoelectric substrate 201. Each of the edge portion 2021 and the edge portion 2022 is defined by a side surface that connects a first principal surface of the dielectric layer 202 on the IDT electrode 203 side and a second principal surface of the dielectric layer 202 on the piezoelectric substrate 201 side. Specifically, of a plurality of side surfaces connecting the first principal surface and the second principal surface, a first side surface provided between the resonator 101 and the resonator 102 defines the edge portion 2021. Further, of the plurality of side surfaces connecting the first principal surface and the second principal surface, a second side surface that faces the first side surface defines the edge portion 2022. Note that in the case where the angles between the piezoelectric substrate 201 and the first side surface and the second side surface of the dielectric layer 202 are angles other than 90 degrees, the edge portion 2021 and the edge portion 2022 are defined at the farthest portions from an IDT electrode 203 in the first side surface and the second side surface, respectively. The edge portion 2021 is positioned between a reflector 2041 and a reflector 2061, which will be described later. The edge portion 2022 faces the edge portion 2021 in an acoustic wave propagation direction P, which will be described later.

The resonator 101 includes the IDT (InterDigital Transducer) electrode 203 and reflectors 2041 and 2042, which are provided on the dielectric layer 202. Note that the resonators 103 and 108 have configurations similar to that of the resonator 101.

The IDT electrode 203 (first IDT electrode) includes comb-shaped electrodes 203a and 203b. In the IDT electrode 203, the electrode 203a and the electrode 203b are arranged in an alternating fashion in the x direction and are provided so as to face each other in the y direction. Specifically, each of the electrode 203a and the electrode 203b includes a busbar electrode extending in the x direction and a plurality of electrode fingers with bases connected to the busbar electrode. A first busbar electrode of the electrode 203a and a second busbar electrode of the electrode 203b are facing each other in the y direction. Top portions of the plurality of first electrode fingers of the electrode 203a extend toward the second busbar of the electrode 203b, and top portions of the plurality of second electrode fingers of the electrode 203b extend toward the first busbar of the electrode 203a. Moreover, the plurality of first electrode fingers of the electrode 203a and the plurality of second electrode fingers of the electrode 203b interdigitate with each other so as to face each other in the x direction. The IDT electrode 203 may include, for example, a Pt layer or a multilayer body of a Pt layers and an AlCu layer. Further, in addition to a Pt layer or an AlCu layer, the IDT electrode 203 may include, for example, a Ti layer or a NiCr layer. Inclusion of a Pt layer in the IDT electrode 203 facilitates the excitation of Love waves, which are one type of acoustic waves.

When an electrical signal is input to the electrode 203a, an acoustic wave (first acoustic wave) is excited in the piezoelectric substrate 201 and the dielectric layer 202 because of electromechanical coupling. An excited acoustic wave propagates in the x-axis direction, which is the acoustic wave propagation direction P (first direction).

The acoustic wave excited by the electrode 203a reaches the electrode 203b via the dielectric layer 202. Because of electromechanical coupling between the vibrating dielectric layer 202 and the electrode 203b, an electric signal is output from the electrode 203b.

The IDT electrode 203 filters a radio frequency signal by performing operation of outputting, from the electrode 203b, a signal of the frequency band that enables the electrode 203a to excite the piezoelectric substrate 201 and the dielectric layer 202.

The reflector 2041 (first reflector) is adjacent to the IDT electrode 203 on the IDT electrode 205 side in the acoustic wave propagation direction P. Here, the term "adjacent" is defined to mean that the electrode of the IDT electrode 203 and the reflector 2041 are not electrically connected and are provided spatially close to each other. In other words, the term "adjacent" includes the case where the electrode of the IDT electrode 203 is not in contact with the reflector 2041. The same applies in the description below.

The reflector 2041 is a metal layer provided on the dielectric layer 202. The reflector 2041 is provided to reflect, of an acoustic wave excited in the IDT electrode 203, an acoustic wave leaked from the IDT electrode 203 back to the IDT electrode 203 side.

A portion of an acoustic wave generated in the IDT electrode 203 leaks from the IDT electrode 203 and reaches the reflector 2041 after propagating in the acoustic wave propagation direction P. The portion of an acoustic wave reached the reflector 2041 is reflected by the reflector 2041, which is provided on a top surface of the dielectric layer 202 as a mechanical structure. An acoustic wave reflected by the reflector 2041 then reaches the IDT electrode 203 and can be output from the electrode 203b as an electrical signal because of electromechanical coupling. The reflector 2041 can reduce energy loss caused by acoustic waves leaked from the IDT electrode 203.

The reflector 2041 is spaced away from the edge portion 2021 of the dielectric layer 202 by a distance D1. Specifically, the reflector 2041 includes a plurality of electrode fingers, and an electrode finger 20411 closest to an IDT electrode 205 is spaced away from the edge portion 2021 of the dielectric layer 202 by the distance D1. Here, in the planar view of the piezoelectric substrate 201, the distance D1 is the distance from an edge portion 20412 of the electrode finger 20411 on the IDT electrode 205 side to the edge portion 2021 of the dielectric layer 202. Note that the edge portion 20412 of the electrode finger 20411 is an outer edge of the electrode finger 20411 in the planar view of the piezoelectric substrate 201 and is the outer edge defined by at least portion of a side surface that is one of side surfaces that connect a pair of surfaces of the electrode finger 20411 facing each other in the z direction and that is provided on the IDT electrode 205 side. For example, in the case where the side surface of the electrode finger 20411 provided on the IDT electrode 205 side does not have a plane shape and includes a portion curved out toward the reflector 2061 side or a portion curved in toward the reflector 2041 side, the portion of this side surface that becomes the closest to the reflector 2061 is defined as the edge portion 20412. Further, the edge portion 2021 of the dielectric layer 202 is an outer edge defined by at least a portion of a side surface that is one of side surfaces that connect a pair of surfaces of the dielectric layer 202 facing each other in the z direction and that is provided between the reflector 2041 and the reflector 2061. For example, in the case where the side surface of the dielectric layer 202 provided between the reflector 2041 and the reflector 2061 does not have a plane shape and includes a portion curved out toward the reflector 2061 side or a portion curved in toward the reflector 2041 side, the portion of this side surface that becomes the closest to the reflector 2041 is defined as an edge portion 20612. That is to say, in the case where the side surface of the electrode finger 20411 provided on the IDT electrode 205 side and the side surface of the dielectric layer 202 provided between the reflector 2041 and the reflector 2061 are not parallel to each other, the distance D1 is the distance from the position at which the electrode finger 20411 is the closest to the reflector 2061 in the side surface of the electrode finger 20411 provided on the IDT electrode 205 side to the position at which the dielectric layer 202 becomes the closest to the reflector 2041 in the side surface of the dielectric layer 202 provided between the reflector 2041 and the reflector 2061.

The reflector 2042 (third reflector) is provided on the dielectric layer 202 so as to sandwich the IDT electrode 203 with the reflector 2041 in the acoustic wave propagation direction P. The reflector 2042 has a structure similar to that of the reflector 2041. As is the case with the reflector 2041, the reflector 2042 reflects acoustic waves from the IDT electrode 203.

The reflector 2042 is spaced away from the edge portion 2022 of the dielectric layer 202 by a distance D2. Specifically, the reflector 2042 includes a plurality of electrode fingers, and an electrode finger 20421 farthest away from the IDT electrode 205 is spaced away from the edge portion 2022 of the dielectric layer 202 by the distance D2. Here, the distance D2 is the distance from an edge portion 20422 of the electrode finger 20421 on the opposite side of the IDT electrode 205 side to the edge portion 2022. Note that the edge portion 20422 of the electrode finger 20421 is an outer edge of the electrode finger 20421 in the planar view of the piezoelectric substrate 201 and is the outer edge defined by at least portion of a side surface that is one of side surfaces that connect a pair of surfaces of the electrode finger 20421 facing each other in the z direction and that is provided on the opposite side of the IDT electrode 205 side. For example, in the case where the side surface of the electrode finger 20421 provided on the opposite side of the IDT electrode 205 does not have a plane shape and includes a portion curved out toward the opposite side of the IDT electrode 203 or a portion curved in toward the IDT electrode 203 side, the portion of this side surface that becomes the farthest away from the IDT electrode 203 is defined as the edge portion 20421. Further, the edge portion 2022 of the dielectric layer 202 is an outer edge defined by at least portion of a side surface that is one of side surfaces that connect a pair of surfaces of the dielectric layer 202 facing each other in the z direction and that is provided on the reflector 2042 side. For example, in the case where the side surface of the dielectric layer 202 provided on the reflector 2042 side does not have a plane shape and includes a portion curved out toward the opposite side of the IDT electrode 203 or a portion curved in toward the IDT electrode 203 side, the portion of this side surface that becomes the farthest away from the IDT electrode 203 is defined as the edge portion 20422. That is to say, in the case where the side surface of the electrode finger 20421 provided on the opposite side of the IDT electrode 203 and the side surface of the dielectric layer 202 provided on the reflector 2042 side are not parallel to each other, the distance D2 is the distance from the position at which the electrode finger 20421 becomes the farthest away from the IDT electrode 203 in the side surface of the electrode finger 20421 provided on the opposite side of the IDT electrode 203 to the position at which the dielectric layer 202 becomes the farthest away from the IDT electrode 203 in the side surface of the dielectric layer 202 provided on the reflector 2042 side.

In the filter device 10, the resonator 101 is provided in such a way that the distance D1 becomes greater than the distance D2. In other words, in the dielectric layer 202, the resonator 101 is provided in an asymmetric manner with respect to the direction (y direction) vertical to the acoustic wave propagation direction P.

The resonator 102 includes the IDT electrode 205 and the reflectors 2061 and 2062 that are provided directly on the piezoelectric substrate 201. Note that the resonators 104, 105, 106, and 107 have configurations similar to that of the resonator 102. In the resonator 102, the IDT electrode 205 and the reflectors 2061 and 2062 are not necessarily provided directly on the piezoelectric substrate 201 and may alternatively be provided on another dielectric layer that is different from the dielectric layer 202 provided on the piezoelectric substrate. That is to say, the IDT electrode 205 and the reflectors 2061 and 2062 can be provided on an area of the piezoelectric substrate 201 where the dielectric layer 202 is not provided.

The IDT electrode 205 (second IDT electrode) includes a comb-shaped electrodes 205a and 205b. The IDT electrode 205 and the IDT electrode 203 are provided side by side in the acoustic wave propagation direction P. As is the case with the IDT electrode 203, in the IDT electrode 205, the electrode 205a and the electrode 205b are arranged in an alternating fashion in the x direction and are provided so as to face each other in the y direction.

As is the case with the IDT electrode 203, the IDT electrode 205 excites the piezoelectric substrate 201 to generate an acoustic wave (second acoustic wave) that propagates in the acoustic wave propagation direction P.

The IDT electrode 205 filters a radio frequency signal by performing operation of outputting, from the electrode 205b, a signal of the frequency band that enables the electrode 205a to excite the piezoelectric substrate 201.

The reflector 2061 (second reflector) is adjacent to the IDT electrode 205 on the IDT electrode 203 side in the acoustic wave propagation direction P. The reflector 2061 is provided directly on the piezoelectric substrate 201.

As is the case with the reflector 2041, the reflector 2061 can reduce energy loss caused by acoustic waves leaked from the IDT electrode 205.

Of a plurality of electrode fingers of the reflector 2061, an electrode finger 20611 closest to the IDT electrode 203 is spaced away from the electrode finger 20411 of the reflector 2041 by a distance L. Here, the distance L is the distance from the edge portion 20412 of the electrode finger 20411 on the IDT electrode 205 side to the edge portion 20612 of an electrode finger 20621 on the IDT electrode 203 side. Note that in the case where the edge portion 20412 and the edge portion 20612 are not parallel to each other, the distance L may be the distance from the position on the edge portion of the electrode finger 20411 at which the electrode finger 20411 is closest to the IDT electrode 205 to the position on the edge portion of the electrode finger 20611 at which the electrode finger 20611 becomes the closest to the IDT electrode 203.

The distance L is preferably a value that satisfies the relationship 3λ≤L, where λ is a wavelength corresponding to the lower frequency of resonant frequencies of the resonator 101 or the resonator 102. For example, when that lower frequency is about 2.7 GHz, λ is about 1.3 µm. In this case, 3λ is approximately equal to about 3.9 µm, for example. Thus, for example, L is preferably set to about 4 µm or greater. From the viewpoint of downsizing the filter device 10, L may be set to about 4 µm to avoid having an unnecessary large L. Note that from the viewpoint of fabrication, the distance L may be less than or equal to about 10λ, for example.

The distance L may be set based on each of the pitches of the resonator 101 and the resonator 102. Here, the pitch p of the electrode finger of each of the electrode 203a and the electrode 203b of the resonator 101 satisfies the relationship p=w+s, where w is the width of each electrode finger in the x direction and s is the gap between adjacent electrode fingers in the x direction. In this case, the frequency corresponding to the wavelength A that is equal to twice the length of the pitch p is the resonant frequency of the resonator 101.

For example, as illustrated in FIG. 2, in the IDT electrode 203 of the resonator 101, each of the widths of an electrode finger 2031 of the electrode 203b and an electrode finger 2032 of the electrode 203a is w. The electrode finger 2031 and the electrode finger 2032 are spaced away from each other by the gap s. In this case, the pitch p is the distance from an end surface of the electrode finger 2031 on the reflector 2042 side to an end surface of the electrode finger 2032 on the reflector 2042 side. The same applies to the resonator 102.

In the case where the pitch is greater, the corresponding resonant frequency becomes lower. Accordingly, the distance L can be determined by the relationship 3λ≤L, where λ is the wavelength corresponding to one of the resonators 101 and 102 that has a greater pitch.

Note that in the present example embodiment, the configuration is described for the case where the gaps between the electrode fingers of the IDT electrode 203 are an equal distance. However, the configuration may alternatively include gaps having unequal distances. In the case where the gaps are not the equal distance, for example, of a plurality of pitch candidates determined based on the gaps between the electrode fingers of the IDT electrode 203, one of the pitches may be selected in an arbitrary manner, and the selected pitch may be used as the pitch of the resonator 101. The same applies to the pitch of the resonator 102.

The reflector 2062 is provided directly on the piezoelectric substrate 201 so as to sandwich the IDT electrode 205 with the reflector 2061 in the acoustic wave propagation direction P. As is the case with the reflector 2061, the reflector 2062 reflects acoustic waves from the IDT electrode 205.

The resonator 101 and the resonator 102 are spaced away from each other by the distance L in the acoustic wave propagation direction P. Moreover, the dielectric layer 202 is positioned between the reflector 2041 and the reflector 2061.

For example, in some cases, an acoustic wave generated by the IDT electrode 205 penetrates through the reflector 2061 and propagates toward the IDT electrode 203. In this case, the acoustic wave propagates the top surface of the piezoelectric substrate 201. As illustrated in FIG. 3, the dielectric layer 202 is provided between the reflector 2061 and the reflector 2041. Surface acoustic waves penetrating through the reflector 2061 and propagating toward the reflector 2041 and the IDT electrode 203 are attenuated by the dielectric layer 202.

Because the acoustic waves that reach the IDT electrode 203 from the IDT electrode 205 can be attenuated, it becomes possible to reduce or prevent changes in the resonant characteristic of the resonator 101 caused by these acoustic waves. Because of this, it becomes possible to keep a wide filter band of the filter device 10.

Further, the resonator 101 is different from the resonator 102 in that the resonator 101 is provided on the dielectric layer 202. The resonator 101 has an electromechanical coupling coefficient that decreases as the thickness of the dielectric layer 202 becomes thinner. Accordingly, the characteristic of the resonator 101 can be varied by adjusting the thickness of the dielectric layer 202. In addition to the attenuation of leaked waves by the dielectric layer 202, by combining the resonator 101 whose characteristic can be adjusted and the resonator 102, it becomes possible to obtain the filter device 10 that has a wide filter band and retains steepness of filter performance at a frequency in an end portion of this filter band.

Figure 4:
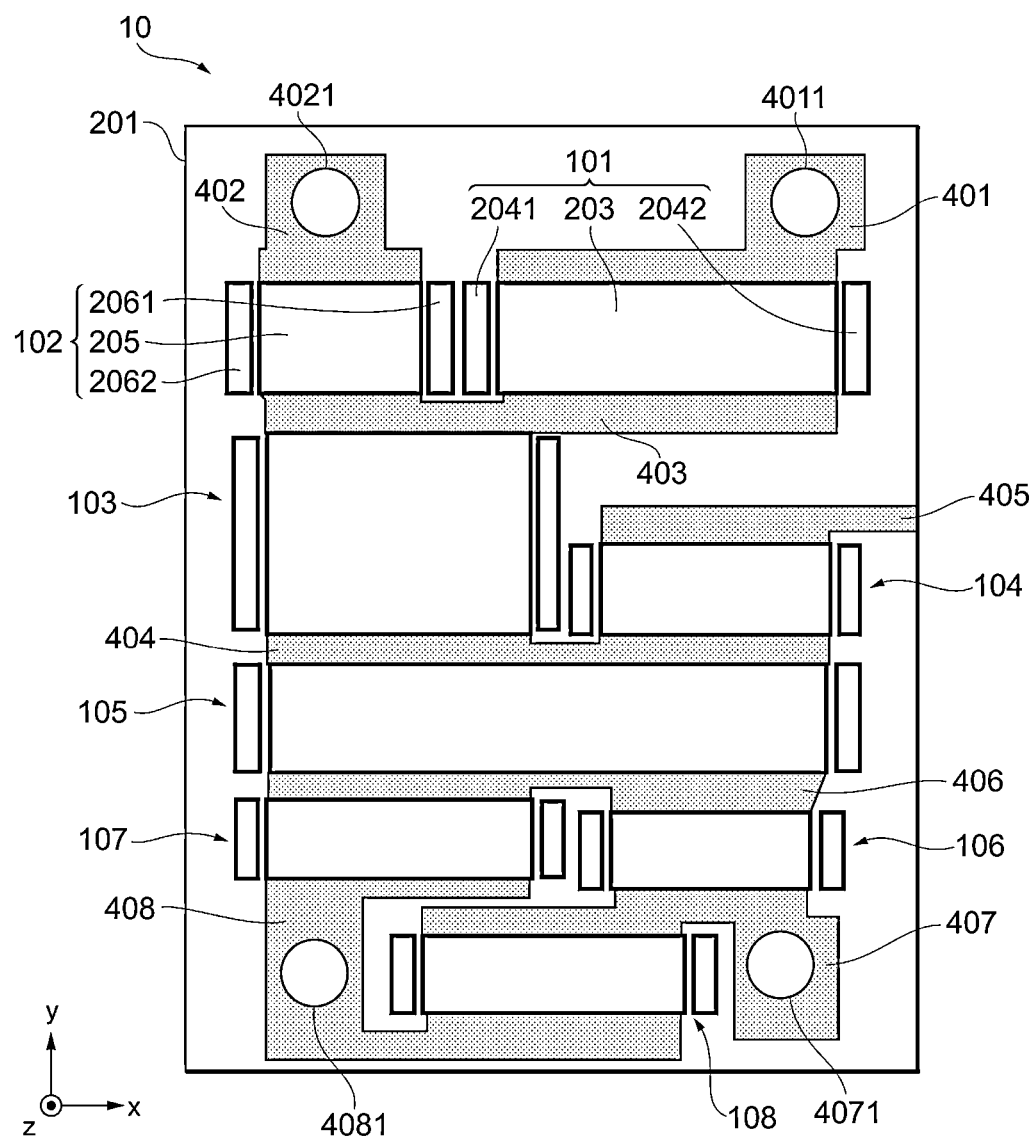
FIG. 4 is a layout diagram of a filter device according to the first example embodiment of the present invention.

Referring to FIG. 4, a specific layout of the filter device 10 is now described. In the filter device 10, the resonators 101 to 108 are connected by wiring lines 401 to 408. In FIG. 4, the resonators 101 to 108 are schematically illustrated by solid line. Further, in FIG. 4, the reflector 2041 and the reflector 2061 are spaced away from each other by about 4 µm or more, as described above.

The wiring line 401 connects a terminal 4011 and the resonator 101. External radio frequency signals are input to the terminal 4011. The wiring line 402 connects a terminal 4021 and the resonator 102. The terminal 4021 is connected to the ground. The wiring line 403 connects the resonator 101, the resonator 102, and the resonator 103 to each other.

The wiring line 404 connects the resonator 103, the resonator 104, and the resonator 105 to each other. The wiring line 405 connects the resonator 104 and the ground (not illustrated). The wiring line 406 connects the resonator 105, the resonator 106, and the resonator 107 to each other.

The wiring line 407 connects the resonator 106, the resonator 108, and a terminal 4071 to each other. The terminal 4071 is connected to the ground. The wiring line 408 connects the resonator 107, a terminal 4081, and the resonator 108 to each other.

The terminal 4081 is connected to the outside of the filter device 10. A signal input to the terminal 4011 is filtered by the filter device 10, and a filtered signal is output to the outside through the terminal 4081.

A second example embodiment is now described. In the description of the second example embodiment and subsequent example embodiments, the descriptions regarding matters common to the first example embodiment will be omitted, and only points different from the first example embodiment will be described. Particularly, similar actions and effects of similar constituent elements will not be repeated in each example embodiment.

Figure 5:
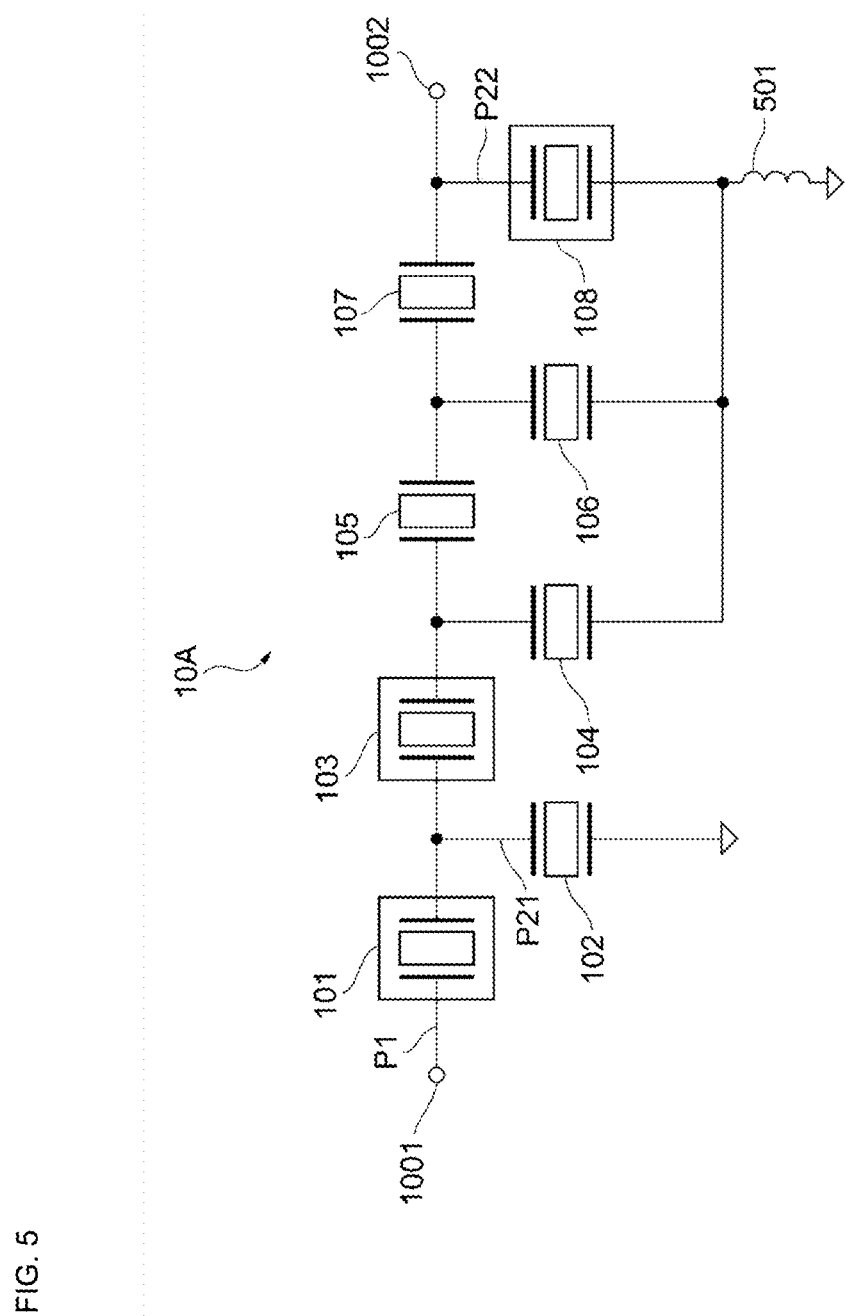
FIG. 5 is a circuit diagram of a filter device according to a second example embodiment of the present invention.

FIG. 5 is a circuit diagram of a filter device 10A according to the second example embodiment. The filter device 10A is different from the filter device 10 in that an inductor 501 is provided between the resonators 104, 106, and 108 and the ground. The inductor 501 may include, for example, a wiring line of the filter device 10A or may be provided on the filter device 10A as a surface mount device.

Providing the inductor 501 enables the adjustment of impedance value, and this enables the filter device 10A to filter a radio frequency signal with a larger bandwidth than the filter device 10.

Figure 6:
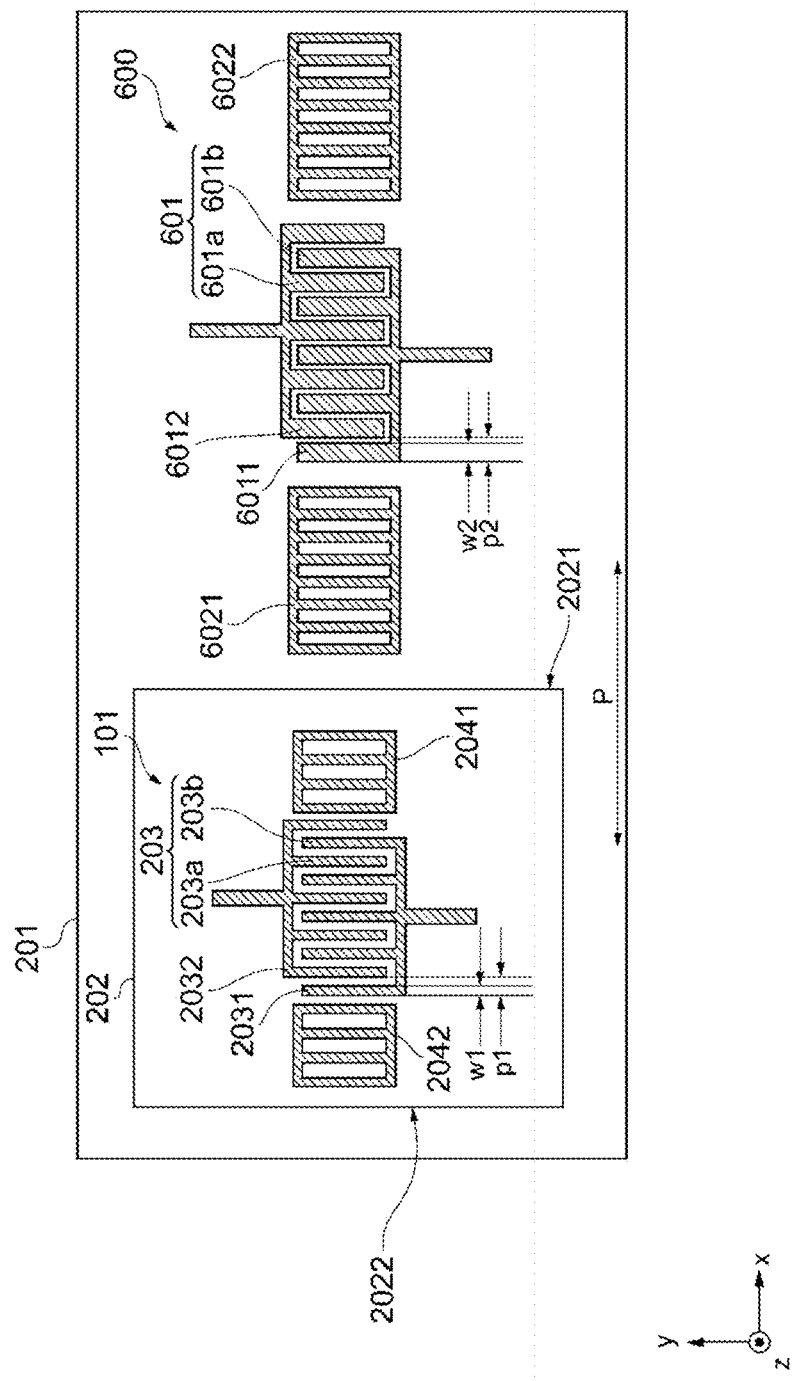
FIG. 6 is a layout diagram for illustrating a filter according to a third example embodiment of the present invention.

A third example embodiment is now described. FIG. 6 illustrates a layout diagram of a resonator 101 including an IDT electrode 203 and a resonator 600 including an IDT electrode 601, which are used in a filter device according to the third example embodiment.

The third example embodiment and the first example embodiment are the same in the configuration of the resonators 101, 103, and 108. However, the third example embodiment is different from the first example embodiment in that the configuration of the resonators 102, 104, 105, 106, and 107 is equal to the configuration of the resonator 600.

The resonator 600 includes the IDT electrode 601 and reflectors 6021 and 6022. The layout of the IDT electrode 601 and the reflectors 6021 and 6022 relative to the resonator 101 is similar to the layout of the IDT electrode 205 and the reflectors 2061 and 2062 relative to the resonator 102. The IDT electrode 601 includes electrodes 601a and 601b.

The resonator 600 is different from the resonator 102 according to the first example embodiment in that the duty ratio of the IDT electrode 601 is different from that of the resonator 101.

The duty ratio is the ratio of the electrode finger width of the IDT electrode to the pitch of the IDT electrode. Here, the electrode finger width of the IDT electrode is the size of the electrode finger in the acoustic wave propagation direction P. Further, the pitch of the IDT electrode is the sum of the width of a certain electrode finger included in the IDT electrode and the width of an area (size in the acoustic wave propagation direction P) between this certain electrode finger and an electrode finger adjacent to this certain electrode finger. For example, in FIG. 6, focusing on the electrode finger 2031 and the electrode finger 2032 (first electrode finger), a duty ratio d1 (first duty ratio) of the IDT electrode 203 of the resonator 101 is d1=w1/p1. Similarly, focusing on the electrode finger 6011 and the electrode finger 6012 (second electrode finger), a duty ratio d2 (second duty ratio) of the IDT electrode 601 of the resonator 600 is expressed as d2=w2/p2.

As illustrated in FIG. 6, the width w2 of the electrode finger 6011 is greater than the width w1 of the electrode finger 2031. Further, the pitch p1 and the pitch p2 are approximately the same. In this case, the duty ratio of the IDT electrode 601 becomes greater than the duty ratio of the IDT electrode 203.

In the IDT electrodes having different duty ratios, the frequencies of acoustic waves generated in the IDT electrodes are different from each other. Therefore, by varying the duty ratio between the IDT electrodes that are provided side by side in the acoustic wave propagation direction, an acoustic wave that propagates from one of these IDT electrodes and reaches the other IDT electrode and an acoustic wave of the other IDT electrode do not strengthen each other. Because of this, changes in the resonant characteristic of one of the resonators can be reduced or prevented. Because of this, it becomes possible to keep large bandwidths of both resonators. Note that the duty ratio of the resonator 101 may be made greater.

Note that although it is not illustrated, in the filter devices 10 according to the first example embodiment to the third example embodiment, in the case where the dielectric layer provided between the IDT electrode 203 and the piezoelectric substrate 201 is a first electrode layer, a second dielectric layer may further included on the piezoelectric substrate 201 so as to cover the IDT electrodes 203 and 205 and the reflectors 2041, 2042, 2061, and 2062. The material of the second dielectric layer is, for example, silicon dioxide ($SiO_2$) or silicon nitride (SiN). The material of the first dielectric layer and the material of the second dielectric layer may be the same or different from each other.

Example embodiments of the present invention have been described. The filter device 10 according to the first example embodiment includes the piezoelectric substrate 201, the dielectric layer 202 provided on the piezoelectric substrate 201, the IDT electrode 203 provided on the dielectric layer 202, the IDT electrode 205 that is provided on the piezoelectric substrate 201 in an area where the dielectric layer 202 is not provided in such a way that the IDT electrode 205 and the IDT electrode 203 are provided side by side in the acoustic wave propagation direction P, which extends along the principal surface of the piezoelectric substrate 201, the reflector 2041 provided on the dielectric layer 202 so as to be adjacent to the IDT electrode 203 on the IDT electrode 205 side, and the reflector 2061 provided directly on the piezoelectric substrate 201 so as to be adjacent to the IDT electrode 205 on the IDT electrode 203 side, wherein the dielectric layer 202 has the edge portion 2021 positioned between the reflector 2041 and the reflector 2061 in planar view seen from the stacking direction of the piezoelectric substrate 201 and the dielectric layer 202.

Because of this, the dielectric layer 202 can be positioned between the IDT electrode 203 and the IDT electrode 205. The dielectric layer 202 attenuates the acoustic wave that reaches the IDT electrode 203 from the IDT electrode 205. Because of this, changes in the resonant characteristic of the resonator 101 caused by that acoustic wave can be reduced or prevented. Therefore, it becomes possible to keep a large bandwidth of the filter device 10.

Further, in the filter device 10, the resonators can be arranged with a gap shorter than the gap between the resonators required to obtain a certain attenuation in the case where the dielectric layer 202 is absent. Because of this, it becomes possible to downsize the filter device 10.

Further, in the filter device 10, the dielectric layer 202 includes the edge portion 2022 that faces the edge portion 2021 in the acoustic wave propagation direction P, the reflector 2042 provided on the dielectric layer 202 is further included so as to sandwich the IDT electrode 203 with the reflector 2041 in the acoustic wave propagation direction P, and in planar view of the dielectric layer 202, the distance from the edge portion 2021 to the reflector 2041 is longer than the distance from the edge portion 2022 to the reflector 2042.

Because of this, a larger amount of dielectric substance can be provided on the piezoelectric substrate 201 on the side where acoustic waves leaked from the IDT electrode 203 propagates toward the IDT electrode 205. Accordingly, the filter device 10 can further attenuate the acoustic waves.

Further, in the filter device 10, in the planar view of the piezoelectric substrate 201, the edge portion 20412 of the reflector 2041 on the reflector 2061 side and the edge portion 20612 of the reflector 2061 on the reflector 2041 side are spaced away from each other by about 4 μm or more, for example. This enables the dielectric layer 202 to attenuate acoustic waves across a sufficient distance, and further enables the filter device 10 to attenuate acoustic waves more appropriately.

Further, in the filter device according to the third example embodiment, the IDT electrode 203 includes the electrode fingers 2031 and 2032 that are arranged on the dielectric layer 202 so as to have the duty ratio d1, and the IDT electrode 601 includes the electrode fingers 6011 and 6012 that are arranged directly on the piezoelectric substrate 201 so as to have the duty ratio d2 that is different from the duty ratio d1.

In the case where the duty ratio is varied, an acoustic wave that propagates from one of the IDT electrodes and reaches the other IDT electrode and an acoustic wave of the other IDT electrode do not strengthen each other. Because of this, changes in the resonant characteristic of one of the resonators can be reduced or prevented. This enables the filter device to keep large bandwidths of both the resonators.

Further, the filter device 10 includes the line P1 that connects the input terminal 1001 and the output terminal 1002 and the line P21 that branches off from the line P1 and connects the line P1 and the ground. In the filter device 10, the IDT electrode 203 is provided in the line P1, and the IDT electrode 205 is provided in the line P21. Because of this, it becomes possible to ensure a steep change of the filter characteristic at a desired frequency while keeping a wide filter band.

Further, in the filter device 10, the IDT electrode 203 may be provided in the line P22, and the IDT electrode 205 may be provided in the line P1. This enables the filter device 10 to ensure a steep change of the filter characteristic at a desired frequency while keeping a wide filter band. Further, the filter device 10A according to the second example embodiment further includes the inductor 501 provided between the IDT electrode 203 and the ground. Because of this, the adjustment of the impedance value between the input terminal 1001 and the output terminal 1002 can be performed using the inductor 501. Therefore, the filter device 10A can filter a radio frequency signal with a larger bandwidth than the filter device 10.

Further, in the filter device 10, each of the IDT electrode 203 and the IDT electrode 205 may include a Pt layer. By including the Pt layer in each of the IDT electrode 203 and the IDT electrode 205, the filter device 10 can realize filtering that utilizes Love waves, which are one type of acoustic waves.

Further, in the filter device 10, the dielectric layer 202 may be the first dielectric layer, and the second dielectric layer may be further included wherein the second dielectric layer is provided on the piezoelectric substrate 201 so as to cover the IDT electrode 203 and the IDT electrode 205.

Further, it becomes possible to configure a multiplexer that includes the filter device 10 or 10A described in the foregoing example embodiment, which is the filter device 10 that filters a signal of a first frequency band, and a frequency filter device that filters a signal of a second frequency band that is different from the first frequency band.

Note that each of the example embodiments described above is provided to facilitate understanding of the present invention and is not to be construed as limiting the present invention. Example embodiments of the present invention can be modified or improved without departing from the spirit thereof, and the present invention also includes equivalents thereof. That is to say, example embodiments obtained by suitably modifying designs of the respective example embodiments by those skilled in the art are also included in the scope of the present invention. For example, each element, feature, characteristic, etc., included in each example embodiment as well as its arrangement, material, condition, shape, size, and the like are not limited to those exemplified, and may be suitably changed. Further, each example embodiment is for illustrative purposes only, and elements, features, characteristics, etc., illustrated in different example embodiments may be combined or partially exchanged. Resulting example embodiments are also included in the scope of the present invention.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A filter device comprising:
a piezoelectric substrate;
a dielectric layer on the piezoelectric substrate;
a first IDT electrode on the dielectric layer;
a second IDT electrode on the piezoelectric substrate in an area where the dielectric layer is not provided, the second IDT electrode and the first IDT electrode being provided side by side in a first direction that extends along a principal surface of the piezoelectric substrate;
a first reflector on the dielectric layer and the first reflector being adjacent to the first IDT electrode on a side of the second IDT electrode;
a second reflector on the piezoelectric substrate in an area where the dielectric layer is not provided and adjacent to the second IDT electrode on a side of the first IDT electrode; and
a third reflector on the dielectric layer positioned such that the first IDT electrode is between the third reflector and the first reflector in the first direction; wherein
in planar view seen from a surface side of the piezoelectric substrate on which the dielectric layer is provided, the dielectric layer includes a first edge portion positioned between the first reflector and the second reflector and a second edge portion facing the first edge portion in the first direction;
in the planar view of the dielectric layer, a distance from the first edge portion to the first reflector is longer than a distance from the second edge portion to the third reflector; and
a distance L between the first reflector and the second reflector is less than or equal to 10%, where λ is a wavelength corresponding to a lower frequency of the filter device.

2. The filter device according to claim 1, wherein in the planar view of the piezoelectric substrate, an edge portion of the first reflector on a side of the second reflector and an edge portion of the second reflector on a side of the first reflector are spaced away from one another by about 4 µm or more.

3. The filter device according to claim 1, wherein
the first IDT electrode includes a plurality of first electrode fingers arranged on the dielectric layer so as to have a first duty ratio; and
the second IDT electrode includes a plurality of second electrode fingers arranged directly on the piezoelectric substrate so as to have a second duty ratio, the second duty ratio being different from the first duty ratio.

4. The filter device according to claim 1, further comprising:
a first line that connects a first terminal and a second terminal; and
a second line that branches off from the first line and connects the first line and ground; wherein
the first IDT electrode is provided in the first line; and
the second IDT electrode is provided in the second line.

5. The filter device according to claim 4, further comprising:

an inductor between the first IDT electrode and the ground.

6. The filter device according to claim 1, further comprising:
a third line that connects a third terminal and a fourth terminal; and
a fourth line that branches off from the third line and connects the third line and ground; wherein
the first IDT electrode is provided in the fourth line; and the second IDT electrode is provided in the third line.

7. The filter device according to claim 1, wherein each of the first IDT electrode and the second IDT electrode includes a Pt layer.

8. The filter device according to claim 1, further comprising:
a second dielectric layer provided on the piezoelectric to cover the first IDT electrode and the second IDT electrode; wherein
the dielectric layer is a first dielectric layer.

9. The filter device according to claim 1, wherein the distance L satisfies a relationship $3\lambda \leq L$.

10. The filter device according to claim 9, wherein $3\lambda$ is equal to about 3.9 μm.

11. The filter device according to claim 1, wherein the lower frequency is about 2.7 GHZ and $\lambda$ is about 1.3 μm.

12. The filter device according to claim 1, wherein L is about 4 μm or greater.

13. A multiplexer comprising:
the filter device according to claim 1 to filter a signal of a first frequency band; and
another filter device to filter a signal of a second frequency band, the second frequency band being different from the first frequency band.

14. A filter device comprising:
a first terminal;
a second terminal;
a first acoustic wave resonator in a first line that connects the first terminal and the second terminal; and
a second acoustic wave resonator in a second line that branches off from the first line and connects the first line and ground; wherein
one of the first acoustic wave resonator and the second acoustic wave resonator includes:
a piezoelectric substrate;
a dielectric layer on the piezoelectric substrate;
a first IDT electrode on the dielectric layer; and
a pair of first reflectors on the dielectric layer on two opposing sides of the first IDT electrode;
another of the first acoustic wave resonator and the second acoustic wave resonator includes:
a piezoelectric substrate;
a second IDT electrode on the piezoelectric substrate without the dielectric layer interposed therebetween; and
a pair of second reflectors on the piezoelectric substrate without the dielectric layer interposed therebetween on two opposing sides of the second IDT electrode;
the first acoustic wave resonator and the second acoustic wave resonator are side by side in a propagation direction of an acoustic wave generated in the piezoelectric substrate;
in planar view seen from a surface side of the piezoelectric substrate on which the dielectric layer is provided, the dielectric layer includes an edge portion between the pair of first reflectors and the pair of second reflectors;
in the planar view of the dielectric layer, the edge portion is closer to the pair of second reflectors than to the pair of first reflectors; and
a distance L between one of the pair of the first reflectors and one of the pair of the second reflectors is less than or equal to $10\lambda$, where $\lambda$ is a wavelength corresponding to a lower frequency of the first acoustic wave resonator or the second acoustic wave resonator.

15. The filter device according to claim 14, wherein the distance L satisfies a relationship $3\lambda \leq L$.

16. The filter device according to claim 15, wherein $3\lambda$ is equal to about 3.9 μm.

17. The filter device according to claim 14, wherein the lower frequency is about 2.7 GHZ and $\lambda$ is about 1.3 μm.

18. The filter device according to claim 14, wherein L is about 4 μm or greater.

19. The filter device according to claim 14, wherein in the planar view of the piezoelectric substrate, an edge portion of the first reflector on a side of the second reflector and an edge portion of the second reflector on a side of the first reflector are spaced away from one another by about 4 μm or more.

20. The filter device according to claim 14, wherein
the first IDT electrode includes a plurality of first electrode fingers arranged on the dielectric layer so as to have a first duty ratio; and
the second IDT electrode includes a plurality of second electrode fingers arranged directly on the piezoelectric substrate so as to have a second duty ratio, the second duty ratio being different from the first duty ratio.

* * * * *